(12) United States Patent
Wakatsuki et al.

(10) Patent No.: US 8,517,035 B2
(45) Date of Patent: Aug. 27, 2013

(54) PROCESSING APPARATUS AND METHOD

(75) Inventors: Takahiko Wakatsuki, Kanagawa-ken (JP); Naoya Hayamizu, Kanagawa-ken (JP); Hiroshi Fujita, Kanagawa-ken (JP); Akiko Saito, Kanagawa-ken (JP); Toshihide Hayashi, Kanagawa-ken (JP); Yukinobu Nishibe, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1163 days.

(21) Appl. No.: 11/625,592

(22) Filed: Jan. 22, 2007

(65) Prior Publication Data

US 2007/0246097 A1    Oct. 25, 2007

(30) Foreign Application Priority Data

Jan. 23, 2006  (JP) .................................. 2006-013652

(51) Int. Cl.
   *B08B 3/00*    (2006.01)
(52) U.S. Cl.
   USPC ........................................................ 134/99.1
(58) Field of Classification Search
   USPC .............................................. 134/95.3, 99.1
   See application file for complete search history.

(56) References Cited

U.S. PATENT DOCUMENTS 1,928,099 A * 9/1933 Foster ............................ 422/160
4,715,317 A * 12/1987 Ishizuka ........................ 118/719
4,724,160 A * 2/1988 Arvidson et al. .............. 438/466
5,351,360 A * 10/1994 Suzuki et al. ................... 15/302
6,610,168 B1 * 8/2003 Miki et al. ..................... 156/344

FOREIGN PATENT DOCUMENTS

| JP | 8-17781 A | 1/1996 |
| JP | 11-329951 A | 11/1999 |
| JP | 2001-250773 | 9/2001 |
| JP | 2002-169304 A | 6/2002 |

OTHER PUBLICATIONS

Machine Translation of Satoshi et al., JP 2002-169304, Jun. 2002.*
Japanese Office Action dated Oct. 20, 2010 in corresponding Japanese Application No. 2006-013652 (with English Translation).

* cited by examiner

*Primary Examiner* — Michael Kornakov
*Assistant Examiner* — David Cormier
(74) *Attorney, Agent, or Firm* — Oblon, Spivak, McClelland, Maier & Neustadt, L.L.P.

(57) ABSTRACT

A processing apparatus includes: a processing chamber configured to contain a workpiece; a first nozzle provided in the processing chamber, the first nozzle discharging vapor onto the workpiece; a wall enclosing the processing chamber; a fluid channel provided inside the wall; a fluid inlet; and a fluid outlet.
The fluid inlet is provided in communication with the fluid channel. The fluid outlet is provided in communication with the fluid channel, where a fluid flows into the fluid inlet, passes through the fluid channel, and flows out of the fluid outlet. A processing method for processing a workpiece moving in a processing chamber, the processing method includes: discharging a vapor from a first nozzle toward the workpiece while flowing a fluid through a fluid channel which is provided inside a wall, the wall enclosing the processing chamber.

6 Claims, 5 Drawing Sheets

PROCESSING APPARATUS AND METHOD

CROSS-REFERENCE TO RELATED APPLICATIONS

This application is based upon and claims the benefits of priority from the prior Japanese Patent Application No. 2006-013652, filed on Jan. 23, 2006; the entire contents of which are incorporated herein by reference.

BACKGROUND OF THE INVENTION

1. Field of the Invention

This invention relates to a processing apparatus and method, and more particularly to a processing apparatus and method suitable to removing photoresist used in lithography.

2. Background Art

In a lithography step of a process of manufacturing a semiconductor device or a liquid crystal panel, for example, an organic resist film is typically used as a patterning mask. The resist film needs removing after the patterning is completed. Methods for removing a resist film include a method of heating and dissolving the resist film with an organic solvent or the like However, use of an organic solvent involves additional costs in facilities for waste liquid disposal. In particular, recent upsizing of semiconductor wafers and liquid crystal panels increases the amount of waste liquid generated in the process of resist peeling. This causes a problem of the associated increase in disposal costs and environmental loads.

JP 2001-250773A, for example, discloses a technology of spraying heated water vapor onto a substrate to peel and remove a resist film for the purpose of reducing costs and environmental loads.

However, the generated water vapor has a high temperature exceeding 100° C. under atmospheric pressure. Thus the temperature increases in the processing chamber and on the wall thereof, requiring careful handling to prevent operators from touching the wall. Furthermore, the temperature difference between the wall and the surroundings of the apparatus increases, and condensation may occur around the apparatus.

SUMMARY OF THE INVENTION

According to an aspect of the invention, there is provided a processing apparatus comprising: a processing chamber configured to contain a workpiece; a first nozzle provided in the processing chamber, the first nozzle discharging vapor onto the workpiece; a wall enclosing the processing chamber; a fluid channel provided inside the wall; a fluid inlet provided in communication with the fluid channel; and a fluid outlet provided in communication with the fluid channel, where a fluid flows into the fluid inlet, passes through the fluid channel, and flows out of the fluid outlet.

According to another aspect of the invention, there is provided a processing method for processing a workpiece moving in a processing chamber, the processing method comprising: discharging a vapor from a first nozzle toward the workpiece while flowing a fluid through a fluid channel which is provided inside a wall, the wall enclosing the processing chamber.

DETAILED DESCRIPTION OF THE INVENTION

Embodiments of the invention will now be described with reference to the drawings.

Figure 1:
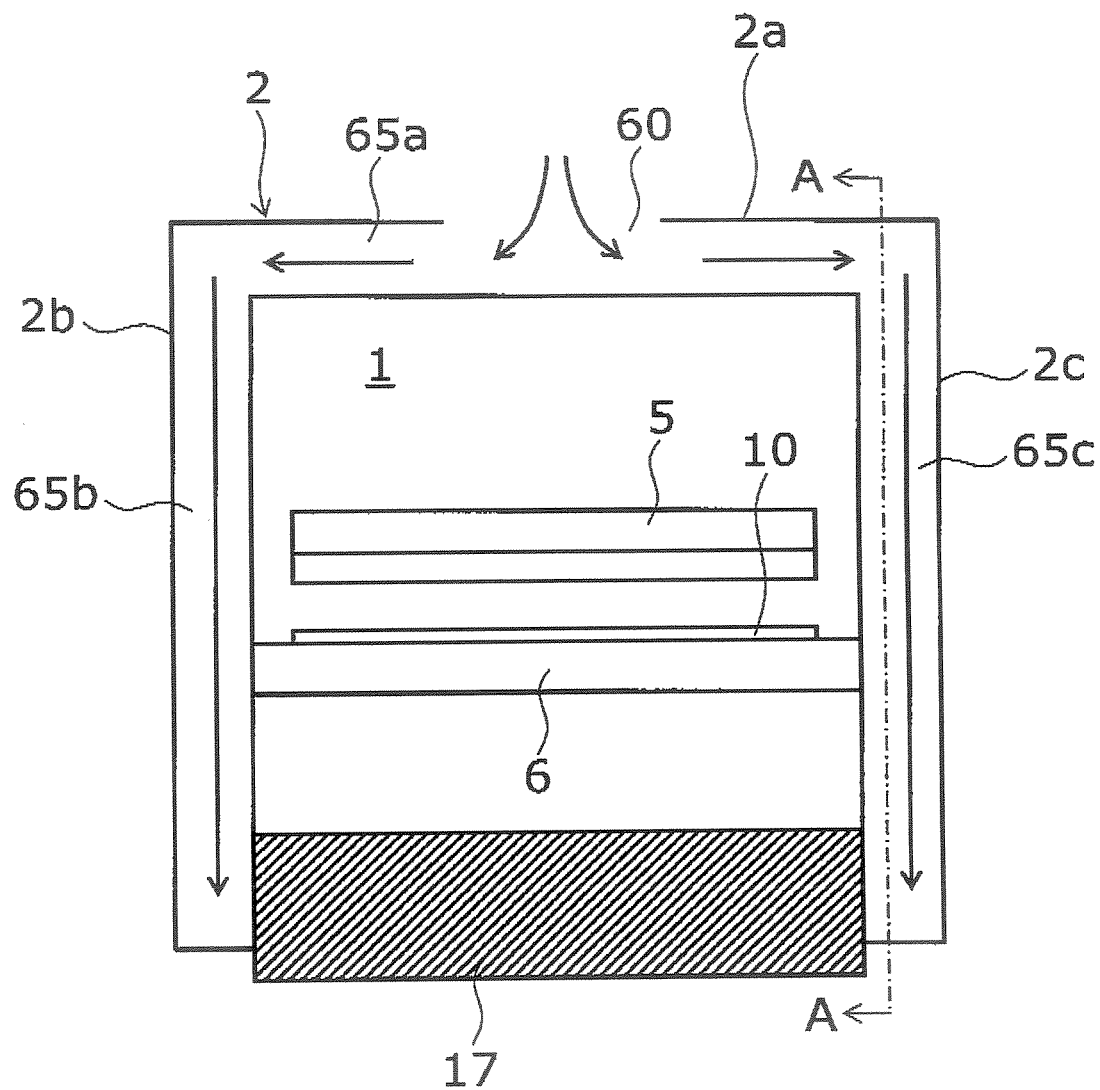
FIG. 1 is a cross-sectional view of the main part of a processing apparatus according to an embodiment of the invention.

FIG. 1 is a cross-sectional view of the main part of a processing apparatus according to an embodiment of the invention.

Figure 2:
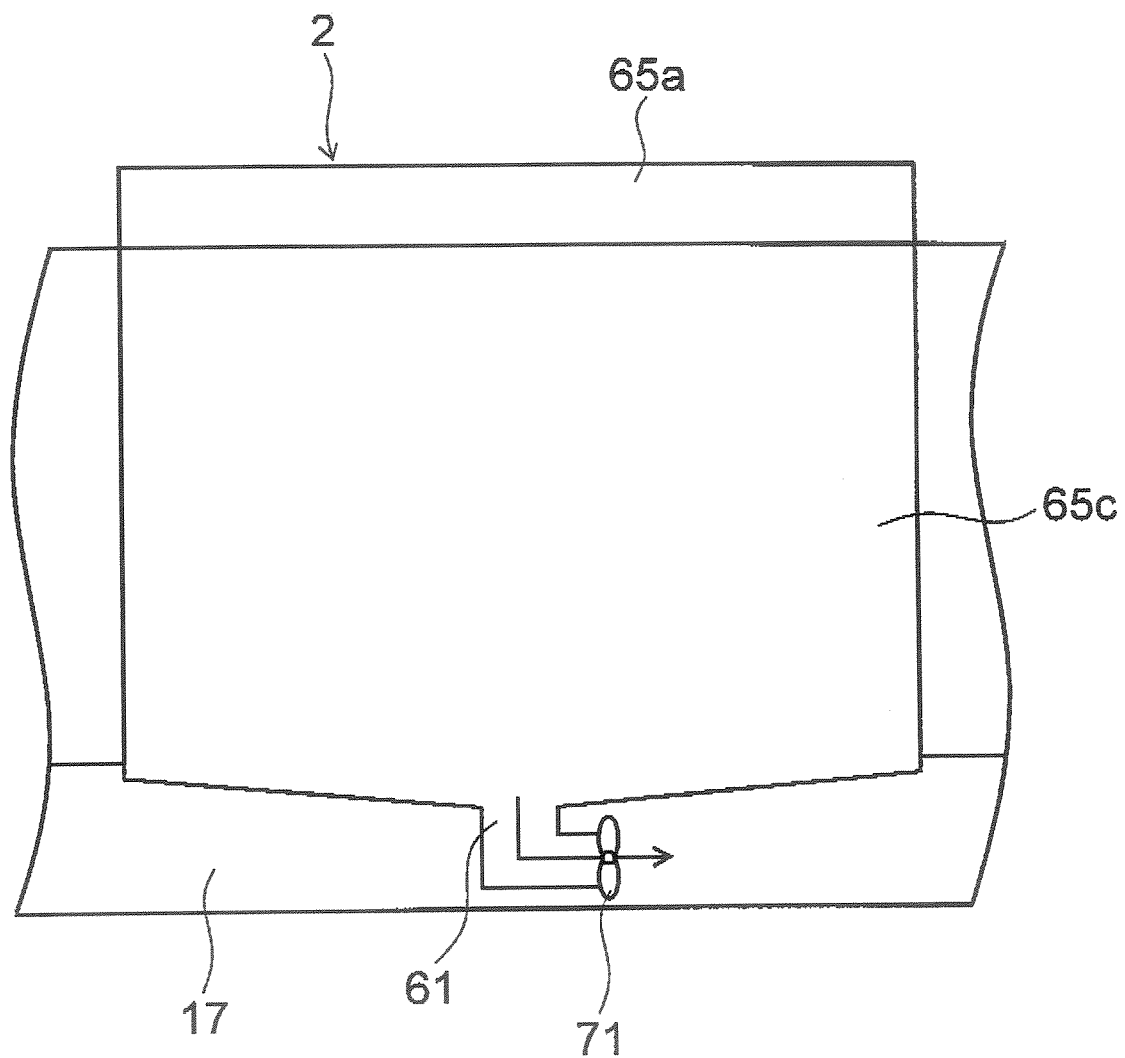
FIG. 2 is a cross-sectional view taken along line A-A in FIG. 1.

FIG. 2 is a cross-sectional view taken along line A-A in FIG. 1.

The processing apparatus according to this embodiment primarily comprises a processing chamber 1 capable of containing a workpiece 10, a first nozzle 5 provided in the processing chamber 1 for discharging vapor onto the workpiece 10, a wall 2 enclosing the processing chamber 1, fluid channels 65a to 65c provided inside the wall 2, a fluid inlet 60 provided in communication with the fluid channels 65a to 65c, and a fluid outlet 61 provided in communication with the fluid channels 65a to 65c. A fluid flows into the fluid inlet 60, passes through the fluid channels 65a to 65c, and flows out of the fluid outlet 61.

The workpiece 10 is, for example, a glass substrate for a liquid crystal panel. However, the workpiece 10 is not limited thereto, but may be a substrate for a flat panel display, a semiconductor wafer, a lead frame, a printed wiring board or the like.

Figure 3:
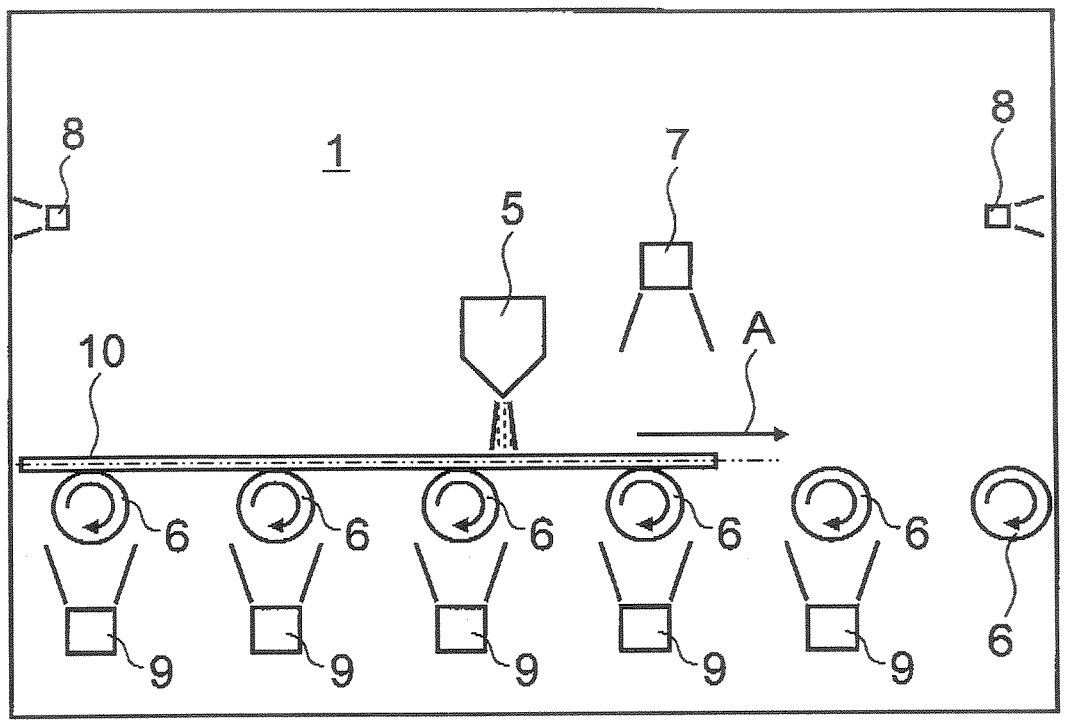
FIG. 3 is a schematic view illustrating the internal configuration of the processing chamber in the processing apparatus according to the embodiment of the invention.

FIG. 3 is a schematic view illustrating the inside configuration of the processing chamber 1 in the processing apparatus according to this embodiment.

Figure 4:
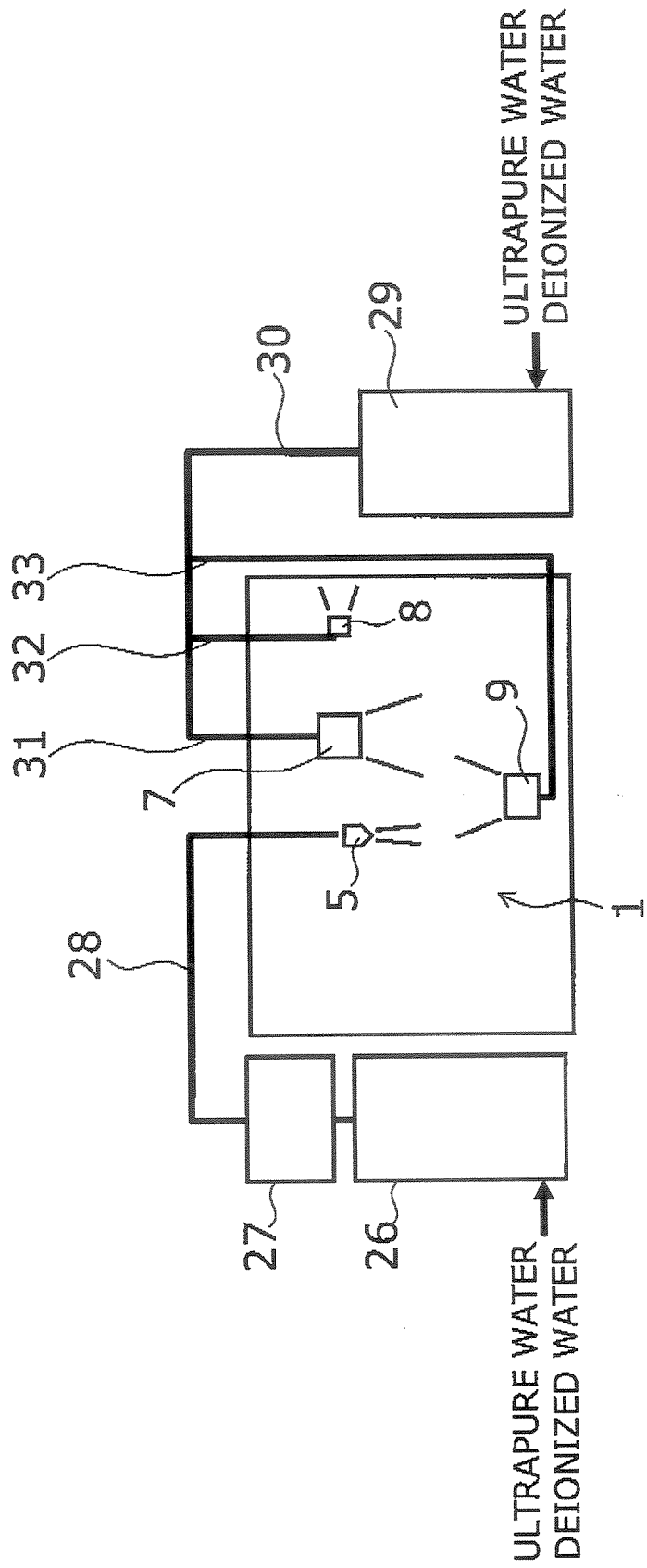
FIG. 4 is a schematic view of processing liquid supply lines to the processing chamber shown in FIG. 3.

FIG. 4 is a schematic view of processing liquid supply lines to the processing chamber 1.

In the processing chamber 1, a plurality of transfer rollers 6 are provided along the moving direction A of the workpiece 10. The transfer rollers 6 are rotatable while supporting the workpiece 10. The workpiece 10 is moved linearly in the moving direction A on the transfer rollers 6. The moving path of the workpiece 10 is imaginarily indicated by a double-dot dashed line in FIG. 3. The workpiece 10 of up to 1.1 meters wide, for example, can be transferred by these transfer rollers 6. The transfer rate can be varied from 1 to 10 meters/min, for example. In addition to the transfer rollers 6, the moving mechanism for the workpiece also includes shafts, motors, driving force transmission mechanisms and the like, which are not shown.

The first nozzle 5 has a discharge port opposed to the moving path of the workpiece 10. The first nozzle 5 extends in the direction passing through the page in FIG. 3, and at the lower end thereof, a slit-shaped discharge port is formed along the extending direction of the first nozzle 5. From the discharge port, the first nozzle 5 can discharge water vapor, chemical solution vapor and the like, as a processing liquid for processing the workpiece 10.

In this embodiment, water vapor, for example, is discharged from the discharge port of the first nozzle 5. As shown in FIG. 4, a vapor generator 26 and a vapor reheater 27 are provided outside the processing chamber 1. The vapor generator 26 generates vapor of ultrapure water or deionized water. The vapor reheater 27 heats the vapor generated in the vapor generator 26 to a prescribed temperature. The heated vapor is passed through a piping 28 and discharged from the discharge port of the first nozzle 5.

The flow rate of ultrapure water or deionized water introduced into the vapor generator 26 for vapor generation is 4 to 10 liters/min, for example. The temperature of vapor discharged from the discharge port of the first nozzle 5 can be controlled in the range of 100 to 140° C., for example.

Here, in light of temperature decrease due to adiabatic expansion that occurs when the water vapor is discharged into atmospheric pressure, the vapor generator 26 and the vapor reheater 27 are used to heat the water vapor to 180 to 300° C. so that the water vapor has a temperature of 100 to 140° C. on the surface of the substrate or other workpiece 10.

Referring again to FIG. 3, immediately downstream of the position of the first nozzle 5 is provided a second nozzle 7, which has a discharge port opposed to the moving path.

Below the transfer rollers 6 are provided a plurality of third nozzles 9, each of which has a discharge port opposed to the transfer roller 6. The third nozzle 9 is placed on the other side of the moving path of the workpiece across the transfer roller 6.

A plurality of fourth nozzles 8 are provided so that their discharge ports are opposed to the inner side face of the wall 2 of the processing chamber 1. The fourth nozzles 8 are placed above the moving path of the workpiece.

Hot water is discharged from each of the second nozzle 7, the third nozzles 9, and the fourth nozzles 8. As shown in FIG. 4, a hot water generator 29 is provided outside the processing chamber 1. Hot water at 95° C., for example, generated by the hot water generator 29 is supplied to the second nozzle 7, the third nozzles 9, and the fourth nozzles 8 through a piping 30 and pipings 31, 33, 32 branched from the piping 30.

As shown in FIG. 1, the wall 2 enclosing the processing chamber 1 has a pair of sidewalls 2b, 2c provided along the moving direction (in FIG. 1, the direction passing through the page) and opposed to each other and an upper wall 2a overlying the processing chamber 1. The processing chamber 1 is enclosed by the sidewalls 2b, 2c, the upper wall 2a, and a base 17.

The wall 2 has a double structure, and the fluid channels 65a to 65c are provided inside the wall 2. Specifically, the fluid channel 65a is provided inside the upper wall 2a, and the fluid channels 65b, 65c are provided inside the sidewalls 2b, 2c, respectively, in communication with the fluid channel 65a. The fluid channels 65a to 65c are separated from the processing chamber 1 by the wall 2 and are not in communication with the processing chamber 1.

The fluid channel 65a extends in the planar direction of the upper wall 2a and is formed as a space having a planar dimension comparable to the planar dimension of the upper wall 2a. As shown in FIG. 1, a fluid inlet 60 in communication with atmospheric pressure and the fluid channel 65a is formed generally at the center of the upper wall 2a.

As shown in FIG. 2, which is a cross-sectional view taken along line A-A in FIG. 1, the fluid channel 65c extends in the planar direction of the sidewall 2c and is formed as a space having a planar dimension comparable to the planar dimension of the sidewall 2c. The top of the fluid channel 65c is in communication with the fluid channel 65a. A fluid outlet 61 is formed at the bottom of the fluid channel 65c in communication therewith. An exhaust fan 71 is provided in the vicinity of the fluid outlet 61.

The fluid channel 65b is similarly provided in the other sidewall 2b. Specifically, the fluid channel 65b extends in the planar direction of the sidewall 2b and is formed as a space having a planar dimension comparable to the planar dimension of the sidewall 2b. The top of the fluid channel 65b is in communication with the fluid channel 65a. A fluid outlet 61 is formed at the bottom of the fluid channel 65b in communication therewith. An exhaust fan 71 is provided in the vicinity of the fluid outlet 61.

Figure 5:
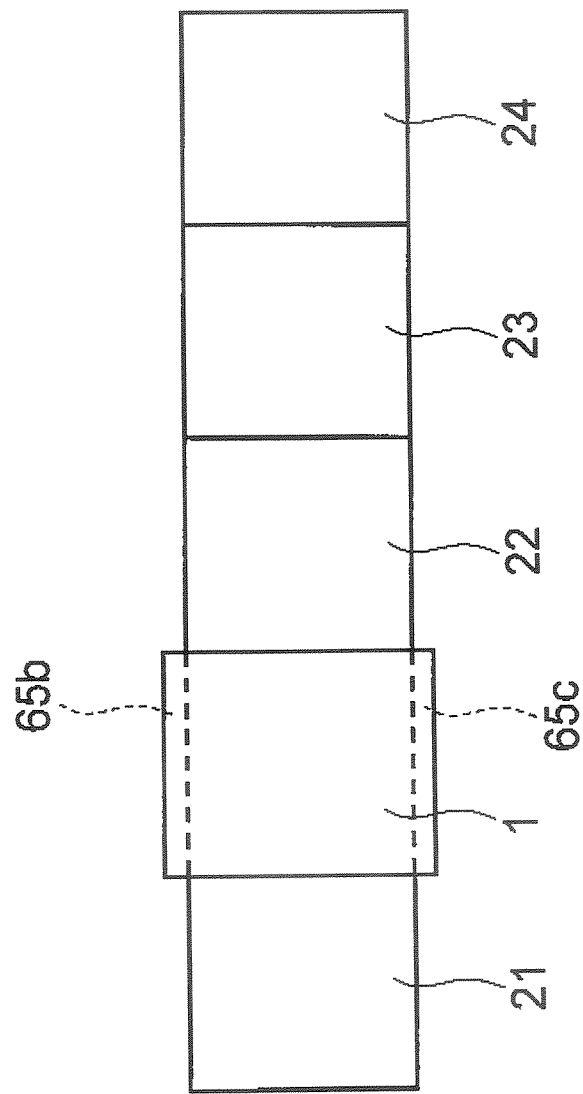
FIG. 5 is a schematic view illustrating the configuration of an inline processing system including the processing apparatus according to the embodiment of the invention.

FIG. 5 is a schematic view illustrating the configuration of an inline processing system including the processing apparatus according to the embodiment of the invention.

A carry-in chamber 21 is disposed before the above-described processing chamber 1. A water rinse chamber 22, a drying chamber 23, and a carry-out chamber 24 are successively disposed after the processing chamber 1.

Next, the processing of the workpiece using the processing apparatus according to the embodiment of the invention is described.

A workpiece 10 is passed through the carry-in chamber 21 into the processing chamber 1 and moved along the moving direction A in the processing chamber 1 by the rotation of the transfer rollers 6.

At this time, water vapor is discharged from the first nozzle 5 toward the workpiece 10. The temperature and impact of this water vapor swells, peels, and blows off the photoresist or other residues formed on the workpiece 10.

Downstream of the first nozzle 5, hot water is sprayed to the workpiece 10 at a high pressure of 0.3 megapascal, for example. Thus the photoresist remaining on the workpiece 10 can be removed.

A portion of the photoresist peeled from the workpiece 10 is mixed in the water vapor discharged from the first nozzle 5 or the water produced by the cooling of this water vapor and ejected through a water outlet (not shown). Another portion of the photoresist may be attached to the transfer rollers 6, and then attached to the backside of the workpiece 10 supported on the transfer rollers 6. However, in this embodiment, such extraneous matter attached to the transfer rollers 6 and the backside of the workpiece 10 can be washed away by a shower of hot water discharged from the third nozzles 9.

In addition to cleaning extraneous matter attached to the transfer rollers 6 and the backside of the workpiece 10, the third nozzles 9 also serve to increase the temperature of the workpiece 10 by heating it from its backside, thereby enhancing the peeling effect of the water vapor.

Part of the photoresist peeled and blown from the workpiece 10 may be scattered upward in the processing chamber 1 and attached to the inner surface (facing the inside of the processing chamber 1) of the wall 2. However, in this embodiment, extraneous matter attached to the inner surface of the wall 2 is washed away by the hot water discharged from the fourth nozzles 8 and ejected outside the processing chamber 1 together with wastewater. Thus the extraneous matter attached to the inner surface of the wall 2 is prevented from falling on and reattaching to the workpiece 10.

As described above, high-temperature vapor and hot water discharged from the nozzles raise the temperature in the processing chamber 1. However, according to this embodiment, the fluid channels 65a to 65c are provided inside the wall 2 of the processing chamber 1, and the exhaust fan 71 provided in the vicinity of the fluid outlet 61 is operated. Hence an airflow is produced inside the wall 2 so that air flows into the fluid channel 65a through the fluid inlet 60 in communication with atmospheric pressure, passes through the fluid channels 65b, 65c, and flows out of the fluid outlet 61. Thus the heat in the processing chamber 1 becomes difficult to conduct to the outer surface of the wall 2. As a result, the temperature increase of the outer surface of the wall, where operators may touch, can be reduced, and the apparatus can be handled safely.

Furthermore, because the outer surface of the wall does not reach high temperature, it is possible to prevent condensation around the apparatus due to the temperature difference with the surroundings of the apparatus.

Moreover, as compared with the case where the outer surface of the wall is cooled down by a liquid cooling jacket attached thereto, for example, overcooling of the inner surface of the wall can be prevented. Thus it is possible to prevent attachment and condensation of contaminants on the inner surface of the wall.

Note that the fan may be provided on the fluid inlet side for pressure feeding of air into the fluid channels. However, in this case, the wind speed distribution in the fluid channels tends to be nonuniform, which is likely to cause drift and stagnation.

In contrast, when the fan is provided on the fluid outlet side as in the embodiment described above, air is pulled by the pressure difference due to the pressure drop near the fan. Thus air can be uniformly pulled, and the air that has removed heat from the processing chamber 1 can be efficiently exhausted from the fluid channels.

The workpiece 10 from which the photoresist or other residues have been removed in the processing chamber 1 as described above is subsequently transferred to the water rinse chamber 22, where the workpiece 10 is rinsed with water. Next, in the drying chamber 23, the workpiece 10 is dried with air knife, for example. Then the workpiece 10 is passed to the subsequent process through the carry-out chamber 24.

Embodiments of the invention have been described with reference to the examples. However, the invention is not limited thereto, but various modifications can be made within the spirit of the invention.

The fluid passing through the fluid channels is not limited to air, but other gas or liquid such as water can also be used. In the case of liquid, it is possible to adopt a liquid circulating mechanism where the liquid flowing into the fluid channel through the fluid inlet, passing through the fluid channel, and flowing out of the fluid outlet is again allowed to flow into the fluid channel through the fluid inlet.

The number of fluid inlets, fluid outlets, and fans, and the position thereof, are not limited to the embodiments described above. The wall is not limited to having a double structure, but may have a structure of triple or more.

The invention is not limited to removal of photoresist or other residues, but is also effective for simple cleaning. Furthermore, the workpiece, processing liquid, specific processing conditions and the like are also not limited to those described above.

The invention claimed is:

1. A processing apparatus comprising:
a processing chamber configured to contain a workpiece;
a moving mechanism configured to linearly move the workpiece in the processing chamber;
a first nozzle provided in the processing chamber, the first nozzle discharging heated vapor onto the workpiece while the workpiece is being moved by the moving mechanism, the heated vapor having a temperature and impact on the workpiece sufficient to blow off residues formed on the workpiece;
a second nozzle provided downstream of a position of the first nozzle, the second nozzle having a discharge port opposed to a moving path of the workpiece, the second nozzle discharging high pressure and hot water onto the workpiece which is being moved by the moving mechanism, so as to remove residues remaining on the workpiece;
a wall enclosing the processing chamber, the wall having a pair of sidewall portions provided along a moving direction of the workpiece and opposed to each other, and an upper wall portion overlying the processing chamber;
a fluid channel provided inside the pair of sidewall portions;
a fluid inlet provided in the upper wall portion, the fluid inlet being in communication with the fluid channel and atmosphere pressure;
a plurality of fluid outlets, each of the fluid outlets being provided in each of the pair of sidewall portions, each of the fluid outlets being in communication with the fluid channel, wherein an air flows into the fluid inlet, passes through the fluid channel, and flows out of the fluid outlets; and
a plurality of exhaust fans, each of the exhaust fans being provided at each of the fluid outlets, each of the exhaust fans introducing the air from the fluid inlet and releases the air from the fluid outlets through the fluid channel.

2. The processing apparatus according to claim 1, wherein the sidewall portions enclose side faces of the processing chamber.

3. The processing apparatus according to claim 2, wherein a fluid channel in communication with the fluid channel provided inside the sidewall portions is provided also inside the upper wall portion.

4. The processing apparatus according to claim 2, wherein the fluid outlets are provided at a lower part of the sidewall portions.

5. The processing apparatus according to claim 1, wherein the moving mechanism includes a plurality of transfer rollers, the processing apparatus further comprising a plurality of third nozzles provided below the transfer rollers, each of the third nozzles has a discharge port opposed to the transfer roller.

6. A processing apparatus according to claim 1, wherein the workpiece has a photoresist on a surface thereof.

* * * * *